US006188555B1

(12) United States Patent
Mitlehner et al.

(10) Patent No.: US 6,188,555 B1
(45) Date of Patent: Feb. 13, 2001

(54) DEVICE FOR LIMITING ALTERNATING ELECTRIC CURRENTS, IN PARTICULAR IN THE EVENT OF A SHORT CIRCUIT

(75) Inventors: Heinz Mitlehner, Uttenreuth; Dietrich Stephani, Bubenreuth; Wolfgang Bartsch, Erlangen, all of (DE)

(73) Assignee: SiCED Electronics Development GmbH & Co. KG, Erlangen (DE)

( * ) Notice: Under 35 U.S.C. 154(b), the term of this patent shall be extended for 0 days.

(21) Appl. No.: 09/426,417

(22) Filed: Oct. 25, 1999

Related U.S. Application Data

(63) Continuation of application No. PCT/DE98/01029, filed on Apr. 9, 1998.

(30) Foreign Application Priority Data

Apr. 25, 1997 (DE) .............................................. 197 17 614
Jun. 24, 1997 (DE) .............................................. 197 26 678
Feb. 5, 1998 (DE) .......................................... 298 01 945 U

(51) Int. Cl.$^7$ ...................................................... H02H 3/18
(52) U.S. Cl. ............................ 361/84; 361/78; 257/367; 257/379
(58) Field of Search ................................. 361/54, 56, 57, 361/58, 111, 91.5, 100, 78, 84; 257/173, 174, 175, 355, 367, 379

(56) References Cited

U.S. PATENT DOCUMENTS

| | | | |
|---|---|---|---|
| 3,769,572 | 10/1973 | Doubt . | |
| 4,454,523 | * 6/1984 | Hill | ...................... 257/264 |
| 5,543,637 | * 8/1996 | Baliga | ...................... 257/77 |
| 6,034,385 | * 3/2000 | Stephani et al. | ...................... 257/263 |

FOREIGN PATENT DOCUMENTS

3502195A1 7/1986 (DE) .
4029783A1 4/1991 (DE) .

(List continued on next page.)

OTHER PUBLICATIONS

"Polyäthylen–Stromwächter für den Kurzschlussschutz" ("Polyethelene current monitor for short circuit protection"), T. Hansson, ABB Technik, dated Apr. 1992, pp. 35–38.

International Publication No. WO 97/23911 (Stephani et al.), Jul. 3, 1997.

International Publication No. WO 95/07571 (Maier et al.), Mar. 16, 1995.

International Publication No. WO 95/01667 (Harris), Jan. 12, 1995.

*Primary Examiner*—Josie Ballato
*Assistant Examiner*—Kim Huynh
(74) *Attorney, Agent, or Firm*—Herbert L. Lerner; Laurence A. Greenberg; Werner H. Stemer

(57) ABSTRACT

A device for limiting an alternating electric current includes a least one passive semiconductor configuration and a protection circuit. The semiconductor configuration is configured such that when a forward voltage is applied thereto, a forward current flows through the semiconductor configuration. The forward current increases monotonously with the forward voltage up to a saturation current at an associated saturation voltage. At a forward voltage above the saturation voltage, the forward current is limited to a limiting current that is smaller than the saturation current. The semiconductor configuration is further configured such that when a reverse voltage is applied, a reverse current flows through the passive semiconductor configuration. The reverse current increases at a first rate monotonously with the reverse voltage up to a given reverse breakdown voltage and, when exceeding the reverse breakdown voltage, the reverse current rises at a second rate greater than the first rate due to a charge carrier breakdown. The protection circuit includes diodes for preventing the passive semiconductor configuration from being driven to the reverse breakdown voltage by a half wave of an alternating current in the reverse direction.

51 Claims, 9 Drawing Sheets

FOREIGN PATENT DOCUMENTS

| | | |
|---|---|---|
| 4401123A1 | 7/1994 | (DE) . |
| 4302687A1 | 9/1994 | (DE) . |
| 9411601 | 10/1994 | (DE) . |
| 260152A1 | 4/1997 | (DE) . |
| 19548443A1 | 6/1997 | (DE) . |

* cited by examiner

DEVICE FOR LIMITING ALTERNATING ELECTRIC CURRENTS, IN PARTICULAR IN THE EVENT OF A SHORT CIRCUIT

CROSS-REFERENCE TO RELATED APPLICATION

This is a continuation of copending International Application PCT/DE98/01029, filed Apr. 9, 1998, which designated the United States.

BACKGROUND OF THE INVENTION

Field of the Invention

The invention relates to a device for limiting alternating electric currents.

In order to supply an electric load or device with an alternating electric current, the load is connected to a line branch of an electrical supply network via a switching device. In order to protect the load against excessively high currents, in particular in the event of a short circuit, switching devices having isolating switches which protect the branch and for which melting fuses are generally used, and switching devices having mechanical power switches with switching times of significantly more than one millisecond (1 ms) are employed in the field of low-voltage switching. If a plurality of loads are operated simultaneously in one line branch and if a short circuit occurs at just one of these loads, it is very advantageous if the loads which are not subject to the short circuit can continue to operate without disruption and only the load which is affected by the short circuit is switched off. For this purpose, current-limiting components ("limiters") are necessary directly upstream of each load. These components thus reliably limit the current of the prospective short circuit current to a predefined, noncritical overcurrent value within a time of significantly less than 1 ms and thus before the breaker (of the line protection switch) provided for the line branch is triggered.

In a current-limiting situation, such current limiters must be able to withstand, depending on the network, high voltages of usually up to 700 V and in some cases up to 1200 V which are present at the component. Since the power loss which occurs in the component is very high, it would be particularly advantageous if the current limiter also automatically reduced (intrinsically safe component) the current to values significantly below the predefined overcurrent value while additionally taking up voltage.

The only passive current limiter available on the market is a device which is described in the paper "Polyäthylen-Stromwächter für den Kurzschlußschutz" ("Polyethylene current monitor for short circuit protection") by T. Hansson, ABB Technik 4/92, pages 35–38 and which has the product name PROLIM. The device is based on a current-dependent conductivity of the grain boundaries of the material employed in this device. However, when the device for current limiting is used frequently, the current saturation value at which the current is limited may change.

Otherwise, in general only active current limiters, in other words current limiters which operate with a control or triggering and which detect the current and limit it through active control when a predefined maximum current value is exceeded, are employed. The German patent document DE 43 30 459 A and the corresponding German utility model DE 94 11 601 U disclose such an active, semiconductor-based current limiter. This active current-limiting semiconductor switch has a first semiconductor region of a predefined conduction type to which in each case one electrode is assigned on surfaces which face away from one another. In the first semiconductor region, further semiconductor regions of the opposite conduction type are disposed spaced apart from one another between the two electrodes. Between the individual further semiconductor regions, channel regions of the first semiconductor region are respectively formed, the channel regions being directed perpendicularly to the two surfaces of the first semiconductor region (vertical channels). A vertical flow of current between the two electrodes is conducted through these channel regions and is thus limited. In order to control the current flow between the two electrodes, a gate voltage, with which the resistance of the channel regions can be controlled, is applied to the oppositely doped semiconductor regions in the first semiconductor region.

German patent application DE 195 48 443 A1, which has been published after two of the priority dates claimed for the instant application and thus cannot be considered as prior art for the respective disclosure of the instant application, discloses a semiconductor configuration having a first semiconductor region of a given conduction type, a contact region which is disposed on a surface of the first semiconductor region, and a second semiconductor region which has the opposite conduction type from the first semiconductor region and is disposed within the first semiconductor region and underneath the contact region. The second semiconductor region extends further in all directions parallel to the surface of the first semiconductor region than the contact region so that in the first semiconductor region at least one channel region is formed. The channel region being bounded in the downward direction by the depletion zone of the p-n junction which is formed between the first semiconductor region and the second semiconductor region, and, in a conductive state, conducting an electric current from the contact region or to the contact region. The at least one channel region is thus disposed laterally in the first semiconductor region and thus has very good saturation properties. On a further surface of the first semiconductor region, which faces away from the aforementioned surface of the first semiconductor region, a further contact region is provided. An operating voltage for the semiconductor region can then be applied between this contact region and the contact region on the other surface of the first semiconductor region.

In one embodiment of the semiconductor configuration described in the published German patent application DE 195 48 443 A1, the channel region is limited, on a side lying opposite the second semiconductor region, by a depletion zone of a further p-n junction, which is formed with the first semiconductor region and at least a third semiconductor region of a conduction type opposite to that of the first semiconductor region. The third semiconductor region is assigned a control electrode for controlling the electrical resistance of the channel region by applying a control voltage. In a further embodiment, the channel region is limited, on a side lying opposite the second semiconductor region, by the depletion zone of at least one Schottky contact. In this embodiment also, a control voltage can be applied to the Schottky contact in order to control the electrical resistance of the channel region.

SUMMARY OF THE INVENTION

It is accordingly an object of the invention to provide a device for limiting alternating electric currents which overcomes the above-mentioned disadvantages of devices of this general type and which, even in the case of rapidly recurring alternating voltages, can robustly and reliably limit the corresponding alternating currents in the event of a short circuit.

With the foregoing and other objects in view there is provided, in accordance with the invention, a device for limiting an alternating electric current, including:

a passive semiconductor configuration connected into a current path of an alternating current and being configured such that when a forward voltage with a first polarity is applied thereto, a forward current flows through the passive semiconductor configuration, the forward current increasing monotonously with the forward voltage, starting from voltage zero, up to a saturation current at an associated saturation voltage and, at a forward voltage above the saturation voltage the forward current being limited to a limiting current smaller than the saturation current, and the passive semiconductor configuration being further configured such that when a reverse voltage with a second polarity opposite to the first polarity is applied, a reverse current flows through the passive semiconductor configuration, the reverse current increasing at a first rate monotonously with the reverse voltage, starting from voltage zero, up to a given reverse breakdown voltage and, when exceeding the reverse breakdown voltage, the reverse current rising at a second rate, the second rate being greater than the first rate due to a charge carrier breakdown; and a protection circuit connected to the passive semiconductor configuration and having diodes, the protection circuit preventing the passive semiconductor configuration from being driven to the reverse breakdown voltage by a half wave of the alternating current having the second polarity.

According to the invention, at least one semiconductor configuration is connected into the current path of the alternating current to be limited and is configured such that, or can be controlled such that, when a forward voltage with a given polarity (forward direction, conducting direction) is applied, a forward current flows through it which rises monotonously, preferably essentially linearly (ohmic characteristic curve) with a forward voltage which increases starting from voltage zero up to a saturation current at an associated saturation voltage and, at a forward voltage above the saturation voltage, is limited to a limiting current below the saturation current, preferably below approximately one fifth of the saturation current. However, in the case of a reversed polarity (reverse direction) this semiconductor configuration cannot limit the current (no symmetrical characteristic curve). Instead, when a reverse voltage is applied a reverse current flows through it which increases monotonously with a reverse voltage which rises starting from voltage zero up to a predefined reverse breakdown voltage, and when the reverse breakdown voltage is exceeded rises quickly as a result of a charge carrier breakdown. However, in the event of a charge carrier breakdown the semiconductor configuration can easily be damaged.

For this reason, according to the invention, a protection circuit for the semiconductor configuration or semiconductor configurations is also provided, the protection circuit protecting each semiconductor configuration against the possibility of the reverse breakdown voltage being reached, or even exceeded, in the half wave of the alternating current whose polarity is in the reverse direction, in particular in the event of an overcurrent or of a short circuit in which high currents occur. The reverse voltage which is normally present at the semiconductor configuration in a half wave of the alternating current without a protection circuit is thus reduced through the use of the protection circuit or the possibility of the semiconductor configuration operating in its reverse direction is virtually entirely prevented.

With this advantageous combination of features, for the first time an alternating current limiter is provided which is configured exclusively with semiconductor components. The alternating current limiter limits as robustly, largely independently of the downstream (attached) load and reliably as alternating current limiters which are equipped with mechanical switches, an alternating current to an acceptable current value, namely the limiting current, in the event of an overcurrent or short circuit.

In three basic embodiments, the protection circuit is implemented in each case using diodes, in particular (bipolar) p-n diodes or (unipolar) Schottky diodes, for which cost-effective standard silicon-based power diodes can be used.

In the first of these three basic embodiments, the protection circuit is implemented with two antiparallel circuits each including a semiconductor configuration and a diode and which are each connected antiserially to one another into the current path of the alternating current.

The properties of the diodes are then tuned to the semiconductor configurations in such a way that during a nominal operation the alternating current flows at least predominantly and preferably virtually completely through the two semiconductor configurations which are connected antiserially, and in a case of an overcurrent or of a short circuit increases monotonously, preferably essentially linearly (ohmic characteristic curve) in each half wave of the alternating current up to the saturation current at the saturation voltage of the semiconductor configuration whose polarity is in the forward direction in this half wave, and in the case of a forward voltage above the saturation voltage is limited by this semiconductor configuration to the limiting current below the saturation current and flows virtually exclusively through the semiconductor configuration lying in the forward direction and at least predominantly through the second diode.

In each antiparallel circuit, the maximum blocking voltage (breakdown voltage) of the associated diode is preferably at least as high as the maximum forward voltage at the limiting current, and preferably as high as the forward breakdown voltage of the associated semiconductor configuration. This ensures that during forward operation of the associated semiconductor configuration, either in a nominal current operation or an overcurrent operation, the diode does not experience a breakdown prior to the semiconductor configuration, that is to say it blocks at least as well as the semiconductor configuration. In addition, the absolute value of the threshold conducting voltage (threshold voltage, barrier voltage) of each diode is lower than the reverse breakdown voltage of the associated semiconductor configuration which is connected in antiparallel, and in addition is less than the saturation voltage of the semiconductor configuration which is connected antiparallel to the respective other diode. The conducting voltage of each diode is also preferably lower at the saturation current of the semiconductor configuration in the respective other antiparallel circuit than the saturation current of this semiconductor configuration, in order to direct the greatest possible portion of the current through the diode in the event of an overload or short circuit.

The flow of current through this first basic embodiment of the current-limiting device is therefore different during nominal operation (rated operation) on the one hand and during critical overcurrent operation or even short circuit operation, on the other hand. The alternating current limiter therefore "detects" as an "intelligent limiter" the current strength even without controlling (passive execution) and in particular without measuring the current, and switches the current correspondingly in order to achieve an optimum effect. During nominal operation, there is only a small current, or no current at all, flowing through the diodes, with the result that the forward losses (conduction losses) are minimized. On the other hand, in the case of an overcurrent or short circuit, the semiconductor configuration provided in the reverse direction is protected against the flow of current and against a rise in its reverse voltage which it brings about, and the diode connected in antiparallel takes over (conducts) the limited current of the semiconductor configuration provided in the forward direction.

The second basic embodiment of the alternating current limiter also provides two semiconductor configurations and two diodes. However, in each case one diode and one semiconductor configuration are then connected in series and the two resulting series circuits are connected in antiparallel. The maximum blocking voltage (off-state voltage, reverse breakdown voltage) of each diode is, in absolute values, at least as high as the maximum reverse voltage (reverse breakdown voltage) of the associated semiconductor configuration connected in series. This ensures that during reverse operation of the associated semiconductor configuration in the case of an overcurrent or short circuit, the diode does not experience breakdown earlier than the semiconductor configuration, that is to say blocks or cuts off at least as well as the semiconductor configuration, and can take over the reverse voltage of the semiconductor configuration.

A certain disadvantage of the aforementioned first and the second embodiments is that the semiconductor configuration with the described properties will generally be significantly more expensive than a simple diode, with the result that comparatively high overall costs have to be accepted as a result of the two semiconductor configurations.

A more cost-effective variant of the alternating current limiter is the third basic embodiment which requires just one single semiconductor configuration which is connected into a Graetz bridge having four diodes as a protection circuit for this semiconductor configuration. The connections are such that with each of the two polarities the alternating current flows through the semiconductor configuration in its forward direction, in each case one diode being connected in the conducting direction lying in the current path upstream and downstream of the semiconductor configuration.

The maximum blocking voltage of each diode is generally preferably at least as high as the maximum forward voltage at the limiting current, and preferably as the forward breakdown voltage of the semiconductor configuration.

In an advantageous embodiment of each of the embodiments of the device, which have been described above, each semiconductor configuration is composed at least partially of a semiconductor material which has a band gap of at least 2 eV. These semiconductors have a significantly higher breakdown strength than the "universal semiconductor" silicon, with the result that the alternating current limiter can be employed for higher alternating voltages. The preferred semiconductor material for a semiconductor configuration is silicon carbide (SiC), in particular monocrystalline silicon carbide of the 3C or 4H or 6H polytype, because SiC has excellent electronic and thermal properties.

The semiconductor configuration or configurations can be integrated, alone or together with one or more diodes, on a semiconductor substrate which is composed in particular of silicon or silicon carbide, however, they can also be connected to one another as discrete components.

In one advantageous development, the at least one semiconductor configuration of the alternating-current-limiting device can have a first electrode, provided as an ohmic contact preferably on at least one contact region which is disposed on a first surface of the first semiconductor region, and a second electrode, disposed on the first surface or preferably on a second surface of the first semiconductor region facing away from the first surface, and a channel region, which lies electrically or can be produced between the first electrode and the second electrode, in a first semiconductor region which is pinched off (covered) when the saturation current of at least one depletion zone (zone with depletion of charge carriers and thus a high electrical resistance) is reached.

The at least one depletion zone which limits or pinches off the channel region is preferably formed by a p-n junction between the first semiconductor region and a second semiconductor region which is provided within the lateral boundaries of the first semiconductor region underneath the contact region and extends further in all directions parallel to the first surface of the first semiconductor region than the contact region. Because of the lateral channel, this embodiment of the semiconductor configuration is particularly resistant to breakdown and, due to a storing of charges in the buried second semiconductor region and the resulting pinching off of the channel region which continues toward the end of the half waves even when the voltage at the two electrodes decreases, it is capable of essentially maintaining the limiting current (blocking current) as an acceptable current value over a given limiting time (blocking time).

If a plurality of contact regions are then provided on the first surface of the first semiconductor region, an associated second semiconductor region can then be provided underneath each contact region, or an associated second semiconductor region can be provided underneath all the contact regions, the second semiconductor region extending further in all directions parallel to the first surface of the semiconductor region than a smallest surface which encompasses all the contact regions. In each case channel regions of the first semiconductor region then run through intermediate spaces between the disjoint second semiconductor regions or through openings in the coherent second semiconductor region, the channel regions provided electrically in series with in each case at least one of the channel regions assigned to the contact regions.

In a further embodiment, the channel region is limited or pinched off on at least one side by at least one depletion zone of a Schottky contact. The Schottky contact can be formed, in particular, with the first electrode and a region of the first semiconductor region lying outside the at least one contact region. This can be achieved, for example, through the use of suitably selected dopings of these two regions. The Schottky contact can, however, also be formed with an additional control electrode, to which a control voltage can be applied, and a region of the first semiconductor region lying outside the at least one contact region.

In one particularly advantageous embodiment, at least one of the depletion zones on the channel region is formed with the depletion zone of an additional p-n junction which is provided between the first semiconductor region and a third semiconductor region, which is disposed on the first surface of the first semiconductor region.

In a first variant of this embodiment having at least one third semiconductor region, the third semiconductor region is placed in contact with a control electrode. As a result of a control voltage being applied to this control electrode, the extent of the depletion zone of the p-n junction, and thus the electrical resistance of the channel region, can be controlled.

In this variant, the channel region can also normally be pinched off and not be opened (generated) again until the control voltage is applied. This controllable semiconductor configuration can be used to implement an active alternating current limiter.

A second variant is characterized by the fact that a charge-storage effect can also be additionally utilized in the third semiconductor region. This is achieved by electrically insulating the third semiconductor region at its surface with an insulator.

However, in a third variant, the first electrode can be placed in contact not only with the at least one contact region of the first semiconductor region but also with the third semiconductor region at its surface which does not adjoin the first semiconductor region, and thus electrically short circuit the contact region and third semiconductor region.

In a fourth variant, the first electrode is additionally electrically coupled to each second semiconductor region, generally through the use of an electrical impedance, in such a way that a predefined relaxation time for the stored charges in the second semiconductor region is established.

In all embodiments in which a charge-store effect is utilized, the semiconductor materials with a high band gap of at least 2 eV are particularly suitable due to their extremely low intrinsic charge carrier concentration (charge carrier concentration without doping), which promotes, or at least makes it possible, to store charges.

Other features which are considered as characteristic for the invention are set forth in the appended claims.

Although the invention is illustrated and described herein as embodied in a device for limiting alternating electric currents, in particular in the event of a short circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
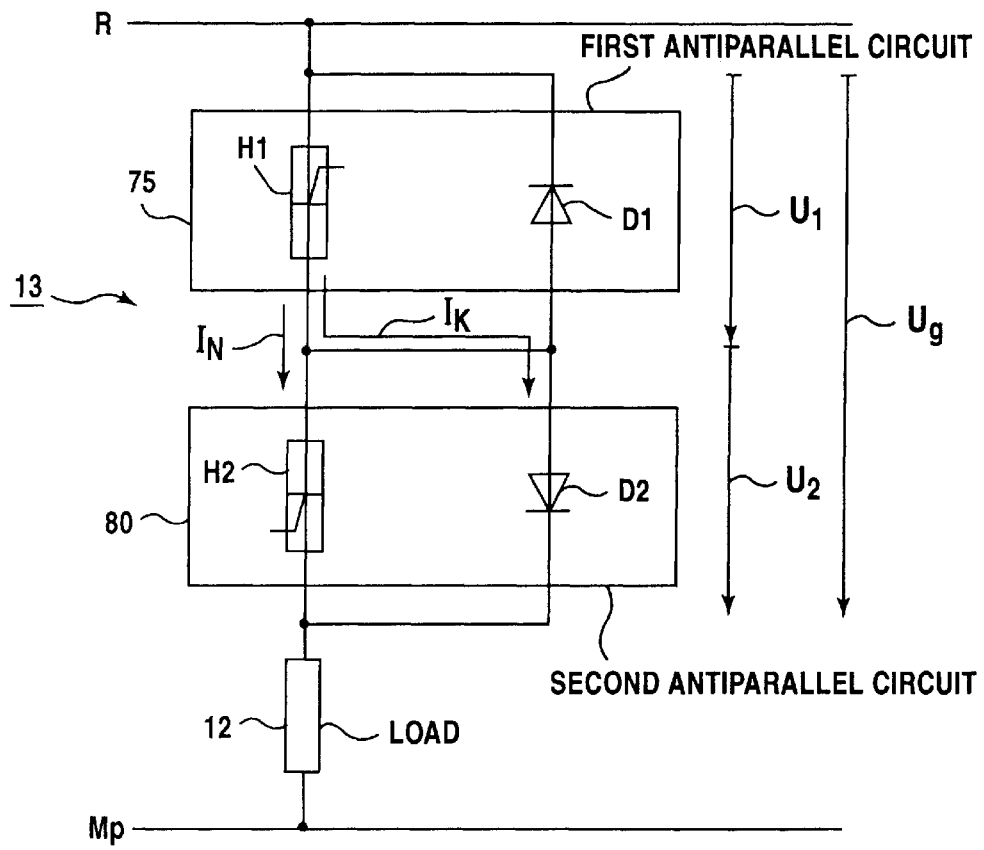
FIG. 1 is a schematic circuit diagram of an alternating current limiter according to the invention having two semiconductor configurations which are connected antiserially and having two protective diodes which are respectively connected in antiparallel.

Corresponding elements in FIGS. 1 to 10 are indicated by corresponding reference numerals. Referring now to the figures of the drawings in detail and first, particularly, to FIG. 1 thereof, there is shown a device 13 for limiting alternating currents which is connected upstream of a load 12 in series in order to protect the electrical load 12 in the event of an electrical short circuit or high overcurrents. The current-limiting device 13 and the load 12 lie in a line branch for the electrical load 12 between an alternating voltage phase R and ground potential (zero potential) Mp. The alternating electrical operating voltage which drops across the entire current-limiting device 13 is designated by $U_g$. The current-limiting device 13 includes a first antiparallel circuit 75 composed of a first semiconductor configuration H1 and of a first diode D1, as well as a second antiparallel circuit 80 composed of a second semiconductor configuration H2 and a second diode D2. The two unipolar, and preferably essentially structurally identical semiconductor configurations H1 and H2 and the two diodes D1 and D2 each have a forward direction (conducting direction) and a reverse direction (blocking direction). The antiparallel connection of the circuit means that the semiconductor configuration H1 or H2 and the associated diode D1 or D2 lie parallel to one another and the electrical voltage $U_1$ or $U_2$, which is thus applied to the semiconductor configuration H1 or H2 and the associated diode D1 or D2, for the semiconductor configuration H1 or H2 is poled (directed) in the forward direction or the reverse direction, and correspondingly in exactly the opposite direction, in the reverse direction or the forward direction, for the associated diode D1 or D2. The two antiparallel circuits 75 and 80 are then connected antiserially to one another, with the result that $U_1+U_2=U_g$ applies for the voltages which drop across them as voltage meshes. In particular, this circuit thus connects both, the two semiconductor configurations H1 and H2 and the two diodes D1 and D2 antiserially to one another, and connects them between the alternating voltage phase R and the load 12. The operating voltage $U_g$ of the current limiting device 13 drops in each case at these two antiseries circuits of the two semiconductor configurations H1 and H2 or diodes D1 and D2.

Figure 2:
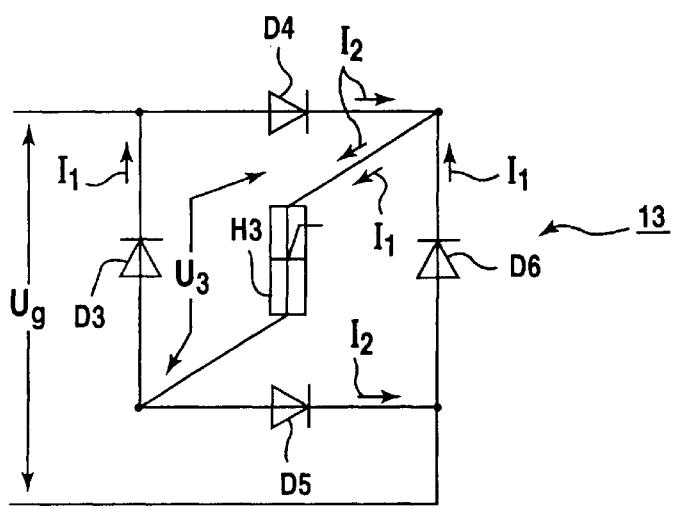
FIG. 2 is a schematic circuit diagram of an alternating current limiter having a semiconductor configuration which is connected into a Graetz rectifier circuit with four protective diodes.

FIG. 2 shows a further device 13 for limiting electrical alternating currents having a Graetz bride circuit including four diodes D3, D4, D5, and D6. A semiconductor configuration H3 is connected into a diagonal of the Graetz circuit. The voltage which is present across the semiconductor configuration H3 is designated by $U_3$. An operating voltage (alternating voltage) $U_g$ of the current-limiting device is applied to the other diagonal.

Figure 3:
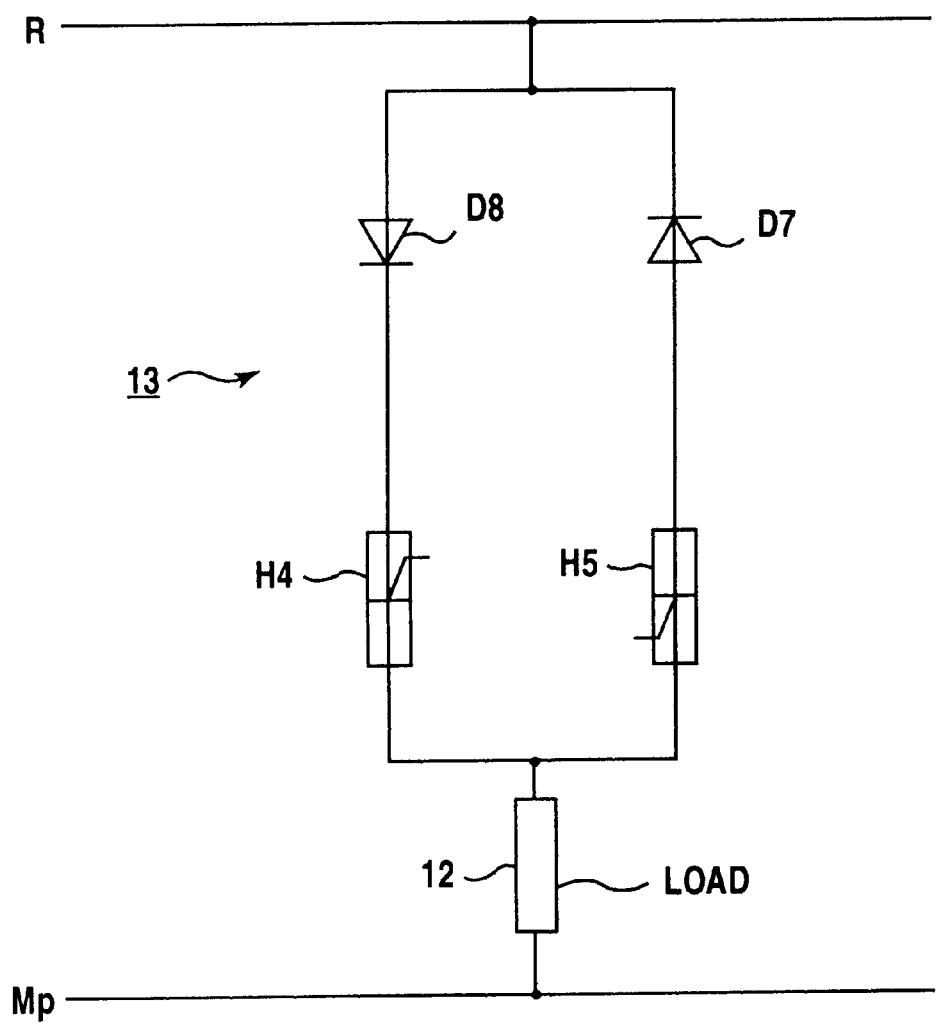
FIG. 3 is a schematic circuit diagram of an alternating current limiter having two series circuits which are connected in antiparallel and are each formed of a semiconductor configuration and a protective diode.

The further device 13 for limiting electrical alternating currents according to FIG. 3 has two preferably identically structured semiconductor configurations H4 and H5. Each semiconductor configuration H4 and H5 is connected in series with, in each case, one diode D8 and D7, respectively, with the same polarity. The two series circuits composed of, in each case, one semiconductor configuration H4 or H5 and one diode D8 or D7 are connected antiparallel to one another, i.e. with opposite polarities. This antiparallel circuit is then connected with the load 12 between the phase R and the ground potential Mp in the current path of the alternating current which is to be limited in the event of a fault.

The two semiconductor configurations H1 and H2 according to FIG. 1, the semiconductor configuration H3 according to FIG. 2 and the two semiconductor configurations H4 and H5 according to FIG. 3 then each have the following properties:

A forward current +I flows in each case through each semiconductor configuration H1, H2, H3, H4 or H5 when a forward voltage, for example $+U_1$ or $+U_2$ is applied, wherein the forward current +I increases, in a forward nominal current range of I=0 A at a voltage of 0 V ($U_1$=0 V and $U_2$=0 V), preferably essentially linearly, i.e. with ohmic characteristics, as the forward voltage ($U_1$ or $U_2$) increases, up to a maximum nominal current. Further, in an overcurrent region lying above the maximum nominal current, the forward current increases monotonously and preferably also essentially ohmically with the forward voltage ($U_1$ or $U_2$) up to a saturation current $I_{sat}$ at an associated saturation voltage $U_{sat}$. If the forward current then tries to rise further, as in the case of a short circuit in the load 12, and the forward voltage ($U_1$ or $U_2$) across the associated semiconductor configuration (H1 and H2) therefore exceeds the saturation voltage $U_{sat}$, each semiconductor configuration (H1 or H2) limits the forward current to a limiting current $I_B$ after the saturation current $I_{sat}$ has been reached. The limiting current $I_B$ lies significantly below the saturation current $I_{sat}$ and is preferably at least five times lower than the saturation current $I_{sat}$. In this way, each semiconductor configuration H1 to H5 is capable of keeping the limiting current in a forward voltage region above the saturation voltage up to a respective forward breakdown voltage. In the case of the forward breakdown voltage, a charge carrier breakdown occurs, due to which the current rises again quickly and, if the voltage persists, it would quickly lead to the destruction of the semiconductor configuration H1 to H5.

On the other hand, when a reverse voltage ($-U_1$ or $-U_2$), which is polarized in a direction opposite to the forward voltage, is applied, a reverse current −I flows through each semiconductor configuration (H1 and H2), the reverse current −I rising, in a reverse nominal current range, again preferably essentially linearly, i.e. with ohmic characteristics, from I=0 A at a voltage of 0 V ($U_1$=0 V or $U_2$=0 V), as the reverse voltage ($-U_1$ or $-U_2$) increases in absolute value (increases in magnitude, drops in absolute terms with the selected signs) up to a maximum reverse nominal current, and, in an overcurrent range, which lies above the maximum nominal current in absolute value, increases monotonously, preferably also essentially ohmically, as the reverse voltage rises further in absolute value, up to a given reverse breakdown voltage at which a charge breakdown takes place and the semiconductor configuration H1 or H2 or H3 or H4 or H5 no longer shows any controlled behavior.

The properties of the diodes D1 to D8, embodied in particular as p-n rectifier diodes or else as Schottky diodes, in the devices 13 according to FIGS. 1 to 3 are adapted in the following way to the properties of the associated semiconductor configurations H1 to H5:

In the variant according to FIG. 1, in each antiparallel circuit 75 and 80 the reverse breakdown voltage of the associated diode D1 or D2 is at least as high as the conducting breakdown voltage of the associated semiconductor configuration H1 or H2, and the conducting voltage (in the forward direction of the diode) of the diode D1 or D2 at the saturation current $I_{sat}$ of the semiconductor configuration H2 or H1 of the respective other antiparallel circuit 80 or 75 is lower than the saturation voltage of said semiconductor configuration H2 or H1. The threshold voltage of each diode D1 and D2 is lower than the reverse breakdown voltage of the associated semiconductor configuration H1 or H2, so that sufficient current flows through the diode D1 or D2 before the semiconductor configuration H1 or H2 experiences a "breakdown". As a result, the electric current between R and Mp in the nominal current range (referred to as nominal current $I_N$) flows essentially via the series circuit of the two semiconductor configurations H1 and H2 and not via the diodes D1 and D2 which, owing to their threshold voltage, are subject to a significantly higher conducting resistance than the semiconductor configurations H1 and H2. The diodes D1 and D2 thus virtually no longer contribute to the power loss of the device 13 during nominal operation. On the other hand, in the event of an overload or short circuit, in each case the diode D1 or D2 which is connected in the conducting direction takes over, depending on the polarity of the alternating current, the limiting current (designated as limited short circuit current $I_K$) of the semiconductor configuration H2 or H1, which is driven into the blocking state (off-state) in the forward direction, of the respective other antiparallel circuit 80 or 75. The limited current $I_K$ then flows in each case via a semiconductor configuration H1 or H2 and a diode D2 or D1. As a result, the semiconductor configuration H2 or H1 which lies parallel to the current-conducting diode D2 or D1 is not driven to high voltages by the limiting current $I_K$ of the other semiconductor configuration H1 or H2, and this semiconductor configuration H2 or H1 is thus prevented from "burning out" as a result of a charge carrier breakdown. The illustrated alternating-current-limiting circuit according to FIG. 1 automatically detects as an "intelligent limiter", an overload or short circuit situation without control and without the need to measure the current, even in the case of passive semiconductor configurations H1 and H2.

In the embodiment of the alternating-current-limiting device 13 according to FIG. 2, the four diodes D3 to D6 are selected in the rectifier bridge circuit (Graetz bridge) in such a way that the maximum blocking voltage of each diode D3 to D6 is preferably at least as high as the maximum forward voltage of the semiconductor configuration H3 at its limiting current, and preferably at least as high, and preferably higher, than the forward breakdown voltage of the semiconductor configuration H3. In addition, each diode D3 to D6 is embodied in such a way that in its conducting direction it can tolerate the limiting current of the semiconductor configuration H3. When the operating alternating voltage $U_g$ is applied, the alternating current then flows in a half wave as current designated by $I_1$, firstly through the diode D6 in its conducting direction, then through the semiconductor configuration H3 in its forward direction and then through the diode D3 in its conducting direction, and in the other half wave as current designated by $I_2$, firstly through the diode D4, then through the semiconductor configuration H3 in its forward direction and then through the diode D5. The connections are thus such that with each of the two polarities the alternating current flows through the semiconductor configuration H3 in its forward direction, and for this reason the semiconductor configuration H3 is never driven in its reverse voltage. This embodiment according to FIG. 2 is generally more cost-effective than the embodiment according to FIG. 1, but in comparison with the latter it has the disadvantage that the conducting resistances of the two diodes are always in the current path and the conducting losses during nominal current operation are thus increased.

In the device 13 according to FIG. 3, the maximum blocking voltage (reverse breakdown voltage) of each diode D7 and D8 is at least as high in absolute value as the maximum reverse voltage (reverse breakdown voltage) of the associated semiconductor configuration H5 or H4 which is connected in series. This ensures that in reverse mode of the associated semiconductor configuration H5 or H4 during operation with the overcurrent or a short circuit, the diode D7 or D8 does not experience breakdown earlier than the semiconductor configuration H5 or H4, that is to say cuts off at least as well as the semiconductor configuration H5 or H4 and can, at least to a large extent, take over the reverse voltage of the semiconductor configuration H5 or H4. The semiconductor configurations H4 and H5 are also protected in their reverse directions by this protective circuit. However, this alternating current limiter according to FIG. 3 has the disadvantage that the costs for the two semiconductor configurations H4 and H5 have to be borne, and that there is a diode in the current path in each polarity of the alternating voltage, thus contributing to the power loss.

A semiconductor configuration as described in the above-mentioned published German patent application DE 195 48 443, which is incorporated herein by reference, may for example be used as a current-limiting semiconductor configuration H1 to H5 having the properties described of the exemplary embodiments according to FIGS. 1 to 3. Such a semiconductor configuration corresponds to a JFET with a lateral channel. The polarity of the semiconductor configuration is to be adapted through the selection of the conduction types of the semiconductor regions. In a passive embodiment, a fixed (constant) control voltage (control potential to be more precise) and in an active embodiment a variable control voltage is applied to the control electrode of the semiconductor configuration.

Further exemplary embodiments of semiconductor configurations H1 to H5 which exhibit the aforementioned properties are explained in more detail with reference to FIGS. 4 to 9. The semiconductor configurations illustrated in FIGS. 4 and 5 each include a first semiconductor region 2 of the n-conduction type (electron conduction) and a second semiconductor region 3 of the p-conduction type (hole conduction). The first semiconductor region 2 has a preferably planar surface 20. The second semiconductor region 3 is disposed (buried) underneath this surface 20 within the first semiconductor region 2 and runs laterally on at least its side facing the surface 20 of the first semiconductor region 20, i.e. essentially parallel to the surface 20 of the first semiconductor region 2. The second semiconductor region 3 is preferably produced by ion implantation of dopant particles into the surface 20 of the first semiconductor region 2. A desired doping profile is established by the penetration profile during the ion implantation through the use of the ion energy, taking into account any implantation masks. In particular, this results in the depth of the implanted semiconductor region 3, i.e. the distance between this second semiconductor region 3 and the surface 20 of the first semiconductor region 2 and the vertical extent D of the second semiconductor region 3, i.e. the extent measured perpendicularly with respect to the surface 20 of the first semiconductor region 2. However, in order to fabricate the semiconductor regions 2 and 3, an epitaxial growth of appropriate semiconductor layers and subsequent structuring of these layers can also be used. The vertical extent D of the second semiconductor region 3 is, in particular, between approximately $0.1\,\mu m$ and approximately $1.0\,\mu m$. The lateral extent of the second semiconductor region 3 parallel to the surface 20 of the first semiconductor region 2 in the cross section illustrated is designated by B and is generally selected to be between approximately $10\,\mu m$ and approximately $30\,\mu m$. A p-n junction is formed between the first semiconductor region 2 and the second, oppositely doped semiconductor region 3, the depletion zone (space-charge zone, zone with depletion of charge carriers) is designated by 23 and shown by broken lines. The depletion zone 23 of the p-n junction surrounds the entire second semiconductor region 3. The extent of a depletion zone of a p-n junction into the p region and the n region depends on the charge carrier concentrations resulting from the doping concentrations in accordance with Poisson's Law and the principle of charge conservation as well as on the voltage (potential difference) applied to the p-n junction.

Figure 4:
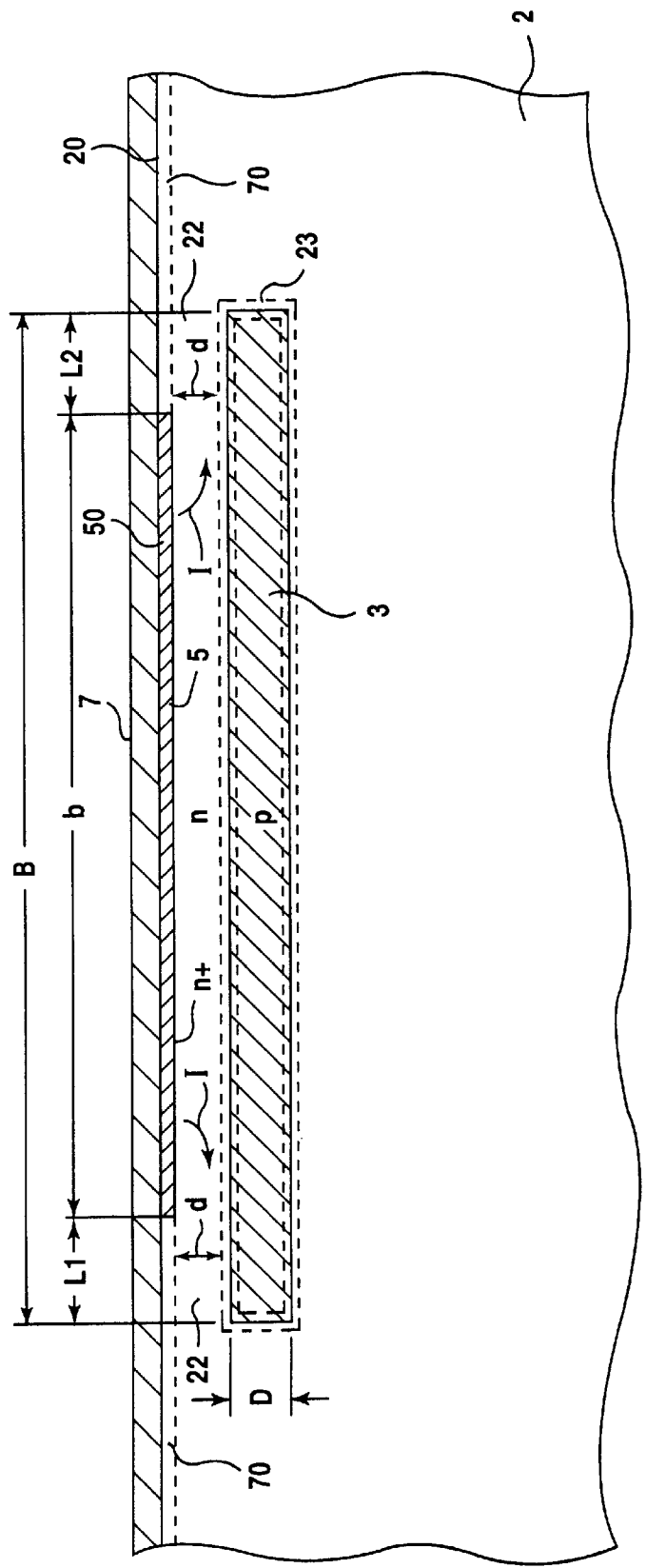
FIG. 4 is a fragmentary cross-sectional view of a semiconductor configuration having a lateral channel region which is bounded in the downward direction by a p-n junction and in the upward direction by a Schottky contact.
Figure 5:
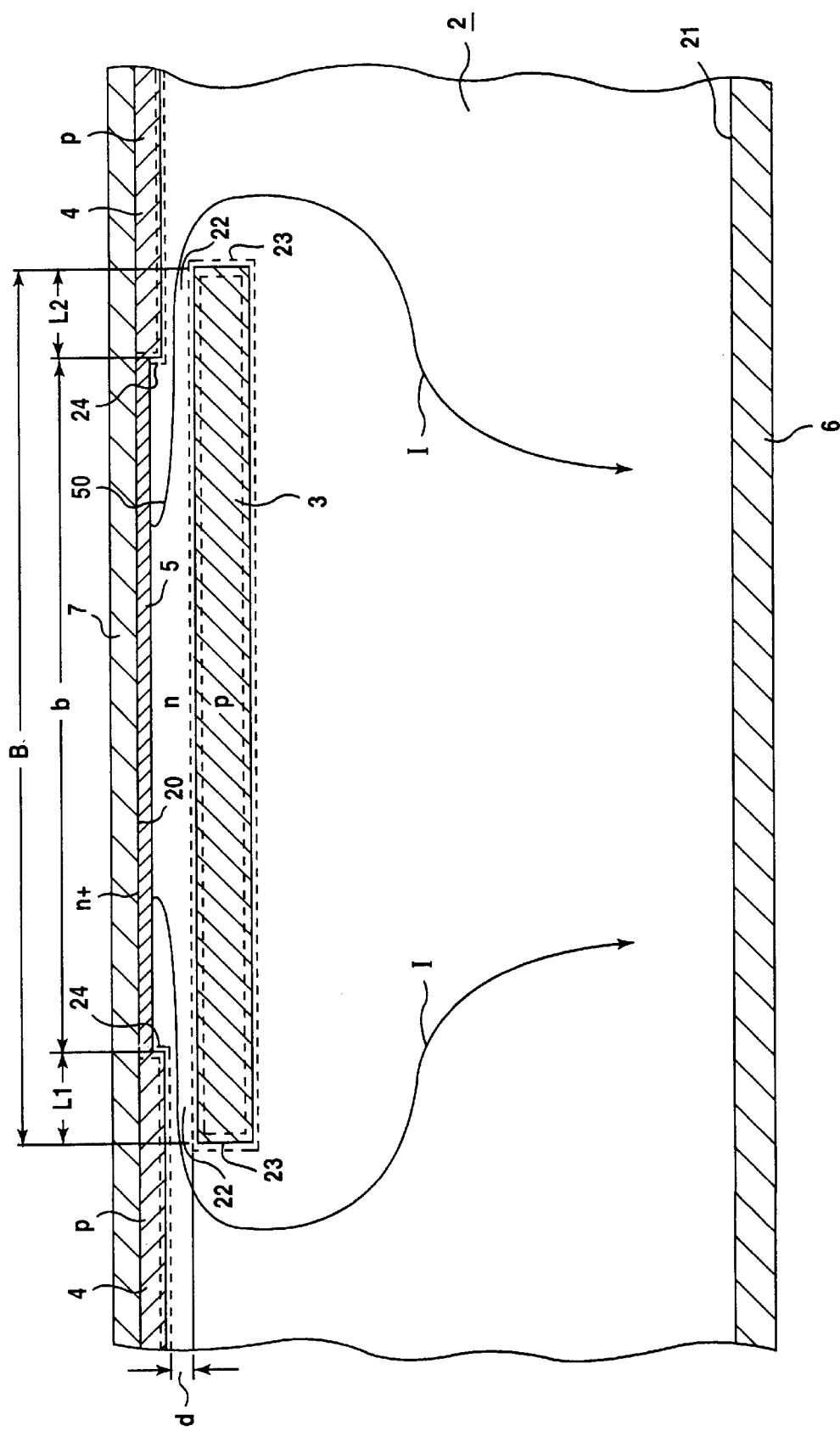
FIG. 5 is a fragmentary cross-sectional view of a semiconductor configuration having a lateral channel region which is bounded in the upward direction and in the downward direction, respectively, by two p-n junctions.

According to FIG. 4 and FIG. 5, a contact region 5 for making ohmic contact is provided on the surface 20 of the first semiconductor region 2. The ohmic contact region 5 is preferably more highly doped than the first semiconductor region 2, and is of the same conduction type, being indicated by $n^+$ in the illustrated exemplary embodiment. The lateral extent of the contact region 5 in the illustrated cross section is designated by b and is smaller in all directions parallel to the surface 20 of the first semiconductor region 2 than the lateral extent B of the second semiconductor region 3. Normally, the lateral extent b of the contact region is between approximately $6\,\mu m$ and approximately $28\,\mu m$. The second semiconductor region 3 and the contact region 5 are disposed relative to one another in such a way that in a projection perpendicular to the surface 20 of the first semiconductor region 2, the projection of the contact region 5 lies completely within the projection of the second semiconductor region 3. A first electrode 7 made of an electrically conductive material, in particular made of polysilicon or a metal, preferably nickel (Ni), tantalum (Ta), titanium (Ti) or tungsten (W) is provided on the free surface 50 of the contact region 5. The first electrode 7 also extends over the adjoining semiconductor surface.

In the embodiment according to FIG. 4, the first electrode 7 then forms an ohmic contact on the contact region 5 and a Schottky contact on the surface 20 of the first semiconductor region 2, the depletion zone (blocking layer) of the Schottky contact being designated by 70 and being shown by broken lines. This can be achieved during doping for example through the use of a suitable setting of the charge carrier concentrations of the contact region 5 and of the first semiconductor region 2. If the first semiconductor region 2 and the contact region 5 are each composed of the particularly advantageous semiconductor material silicon carbide (SiC), in particular a dopant concentration of the contact region 5 of over approximately $1 \cdot 10^{19}\,cm^{-3}$ is selected, and of less than approximately $2 \cdot 10^{16}\,cm^{-3}$ for the first semiconductor region 2. An advantageous material for the first electrode 7 is then nickel (Ni).

On the other hand, in the embodiment according to FIG. 5, a third semiconductor region 4, which is of the opposite conduction type from the first semiconductor region 2, that is to say of the p conduction type in the illustrated exemplary embodiment, and is preferably also produced by ion implantation, is disposed on the surface 20 of the first semiconductor region 2. A p-n junction, the depletion zone of which is designated by 24 and is shown by broken lines, is formed between the first semiconductor region 2 and the third semiconductor region 4. The first electrode 7 also extends over the third semiconductor region 4 and forms an ohmic contact both, on the contact region 5 and on the third semiconductor region 4.

In each case a laterally extending, semiconductor channel region 22 is formed in the first semiconductor region 2 between, on the one hand, the Schottky contact according to FIG. 4 which is disposed on the first surface 20 of the first semiconductor region 2 and is formed with the first electrode 7 or the third semiconductor region 4 according to FIG. 5, and, on the other hand, the buried second semiconductor region 3. The lateral dimensions L1 and L2 of the channel region 22 on different sides of the contact region 5 may be the same or may also be different. Typically, the channel lengths L1 and L2 are between approximately 1 $\mu$m and approximately 5 $\mu$m. The vertical extent of the channel region 22, that is to say the extent which is directed essentially perpendicularly with respect to the surface 20, is essentially selected between approximately 0.1 $\mu$m and approximately 1 $\mu$m. Since the depletion zones, 23 and 70 in FIG. 4 and 23 and 24 in FIG. 5, which extend into the channel region 22 have, as a result of the severe depletion of charge carriers, a significantly higher electrical resistance than the first semiconductor region 2, essentially only the inner part of the channel region 22 is capable of conducting current, this part being bounded in the downward direction by the depletion zone 23 and in the upward direction by the depletion zone 70 in FIG. 4, or 24 in FIG. 5. The vertical extent of this current-conducting inner part of the channel region 22 is designated by d.

In FIG. 5, the third semiconductor region 4 is provided offset laterally with respect to the second semiconductor region 3 in such a way that the two semiconductor regions 3 and 4 overlap along the channel length L1 on one side and the channel length L2 on the other side in a projection on to the surface 20 of the first semiconductor region 2. The third semiconductor region 4 laterally surrounds the contact region 5 and, in the illustrated exemplary embodiment, directly adjoins the contact region 5 so that L1+b+L2=B applies to the lateral extent L1, L2, b, and B. The contact region 5 can, however, also be spaced apart laterally from the third semiconductor region 4.

Furthermore, in the two embodiments according to FIG. 4 and FIG. 5, a second electrode 6 (illustrated only in FIG. 5) is provided, the electrode 6 being provided in such a way that the channel region 22 lies in the current path between the two electrodes. This second electrode can be disposed, for example, on the first surface 20 of the first semiconductor region 2 (lateral structure) or, as shown in FIG. 5, on a further surface 21 of the first semiconductor region 2 facing away from the first surface 20 of the first semiconductor region 2 (vertical structure). Between the second electrode 6 and the first electrode 7 an operating voltage of the semiconductor configuration is applied. In the exemplary embodiments according to FIG. 4 and FIG. 5, the first electrode 7 is connected to the cathode and the second electrode 6 to the anode of the operating voltage source. If the conduction types of the semiconductor regions are interchanged, the polarity of the operating voltage is correspondingly interchanged.

The behavior of the semiconductor configuration when an operating voltage is applied in the conducting direction (forward direction) is then dependent on the electric current I flowing through the semiconductor configuration between the electrodes 6 and 7. This electric current I flows between the two electrodes 6 and 7 in a current direction indicated by arrows, firstly essentially laterally through the channel region 22 in the first semiconductor region 2 and then through the volume part of the first semiconductor region 2, largely vertically in the exemplary embodiment according to FIG. 5. As the current strength I rises, the forward voltage drop between the electrodes 6 and 7 increases so that the second semiconductor region 3 and the Schottky contact according to FIG. 4 or the third semiconductor region 4 according to FIG. 5 are biased negatively with respect to the second electrode 6. The increased forward voltage drop acts as a relatively high blocking voltage at the p-n junction between the first semiconductor region 2 and the second semiconductor region 3 and at the Schottky contact according to FIG. 4 or the third semiconductor region 4 according to FIG. 5 and thus leads to an increase in the depletion zones 23 and 70, and 24, respectively. This results in a reduction in the cross section and a corresponding increase in the resistance of the semiconducting part of the channel region 22. When a specific critical current value is reached (saturation current) $I_{Sat}$, the depletion zones 23 and 70 and 24, respectively, come into contact and completely pinch off (choke off) the channel region 22. Because of the electrical resistance in the channel region 22 which is now considerably higher, the current then goes into saturation and remains at the saturation current value $I_{Sat}$ while the voltage between the electrodes 6 and 7 remains the same. The saturation current $I_{sat}$ of the semiconductor configuration is set to a desired value by the geometric dimensions of the channel region 22, in particular its lateral dimensions L1 and L2 and its vertical extent d, as well as by the charge carrier concentration of the channel region 22 which is defined by the doping.

If, on the other hand, as for example in the event of a short circuit, the forward voltage between the electrodes 6 and 7 increases further after the current I has already reached the saturation current value $I_{Sat}$, the electrical power loss in the channel region 22 rises and the channel region 22 heats up. As the internal temperature in the channel region 22 rises, the mobility of those charge carriers, which have remained in the depletion zones 23 and 70 and 24, respectively, which cover the channel region 22, then decreases. The conductivity of the channel region 22 thus drops further, with the result that, due to the resulting higher drop in the forward voltage between the electrodes 6 and 7, the mobile charge carriers are removed to a greater extent from the depletion zones 23 and 70 and 24, respectively, in the channel region 22. Due to this feedback effect, the semiconductor configuration also quickly limits a strongly rising electrical current, as in the event of a short circuit, to an uncritical current value (limiting current) $I_B$ which lies significantly below the saturation current $I_{sat}$, for example at most by a factor of 0.2 ($I_{sat} > 5I_B$), and when high forward voltages are reached corresponds essentially to the blocking current of the semiconductor configuration for a desired forward breakdown voltage which may typically be between approximately 60 V and approximately 1200 V (for example also 700 V).

In the space-charge zone 23 around the buried second semiconductor region 3, the accumulated space charge remains stored as a function of the intrinsic charge carrier concentration of the semiconductor. As a result of this charge storage, the electrical potential in the second semiconductor region 3 is largely retained even when the voltage between the two electrodes 6 and 7 drops again, and the channel region 22 remains closed. Thus, the semiconductor configuration provides a rapid and reliable limiting of the current I to the blocking current (off-state current) $I_B$. The charge-storing effect is particularly large if the semiconductor material used for the semiconductor regions 2, 3, and 4 of the semiconductor configuration is a semiconductor with a band gap of at least 2 eV, for example diamond, gallium nitride (GaN) or indium phosphide (InP), and preferably silicon carbide (SiC), since such semiconductors, and in particular SiC, have an extremely low intrinsic charge carrier concentration and very low conduction losses. A further advantage of such semiconductors, and in particular SiC, is their high breakdown strength. Preferred polytypes of the SiC are the 4H, 6H and 3C polytypes. Preferred dopants for SiC are boron and aluminum for p doping and nitrogen for n doping.

The doping of the first semiconductor region 2, of the second semiconductor region 3, and of the third semiconductor region 4 determines the blocking ability of the semiconductor configuration if a voltage is applied in the blocking direction (off-state direction) between the two electrodes 6 and 7.

Figure 6:
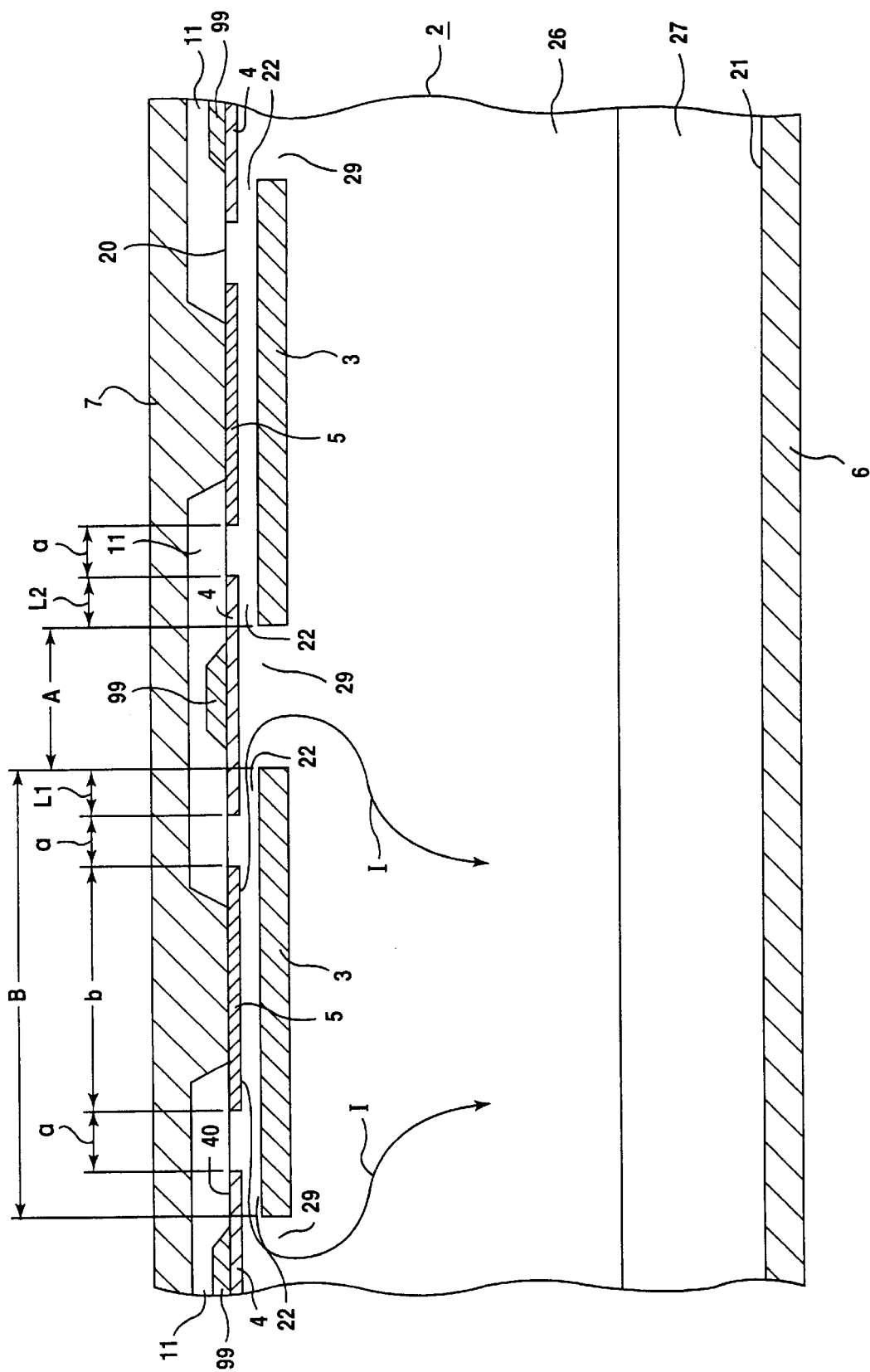
FIG. 6 is a fragmentary cross-sectional view of an embodiment of a semiconductor configuration having lateral and vertical channel regions and having a control electrode.
Figure 7:
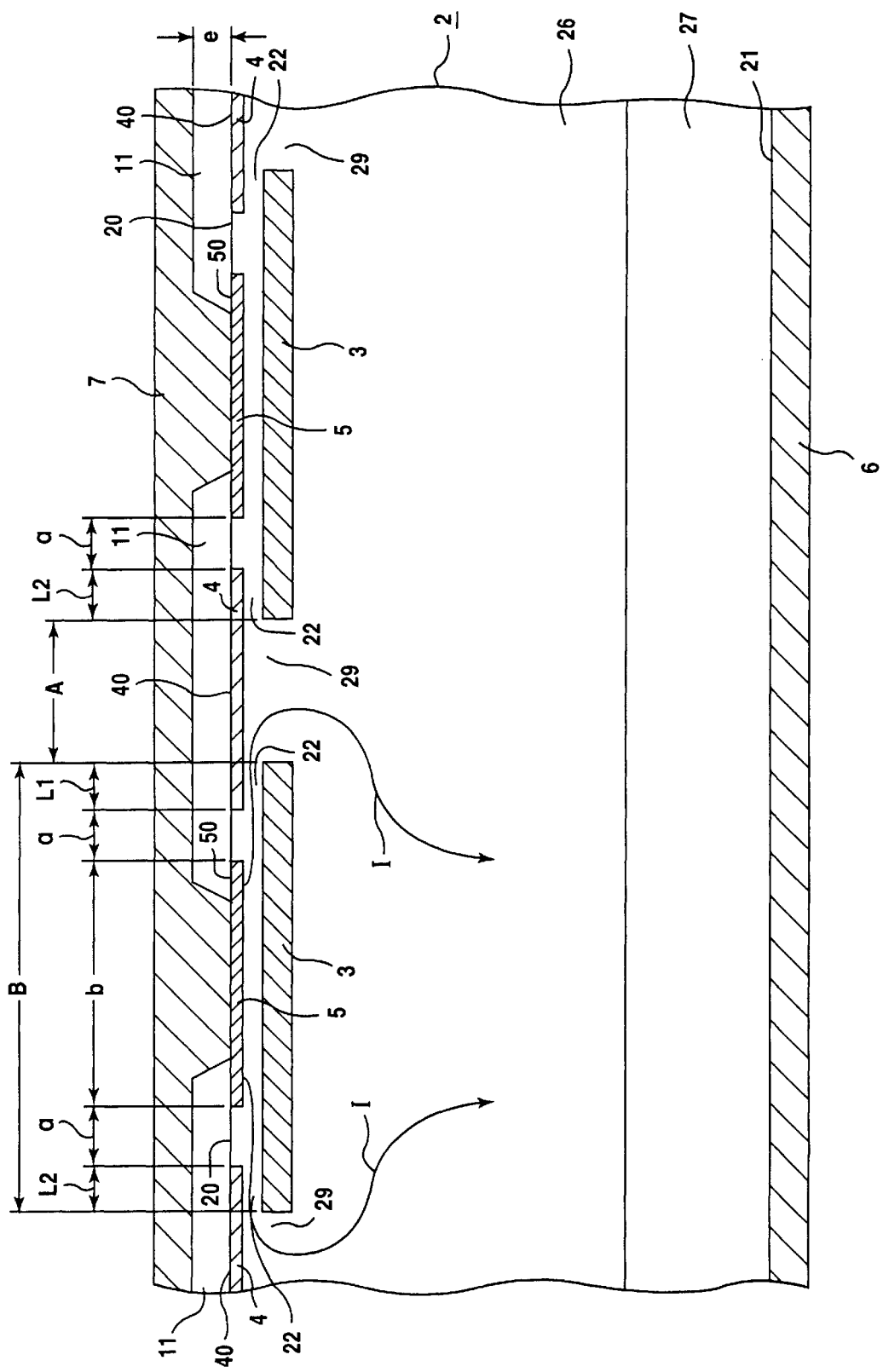
FIG. 7 is a fragmentary cross-sectional view of an embodiment of a semiconductor configuration having lateral and vertical channel regions and having an insulator region on its surface.

FIGS. 6 and 7 each show a semiconductor configuration in which the first semiconductor region 2 is composed of a substrate 27 and of an epitaxially grown semiconductor layer 26 which is disposed thereon, is of the same conduction type and generally has a lower charge carrier concentration than the substrate 27. A plurality of contact regions 5 which have the same doping, but preferably higher doping than the semiconductor layer 26, are provided spaced apart from one another on the surface 20 of the semiconductor layer 26. Only two of those regions 5 are illustrated. Buried underneath the contact regions 5 in the semiconductor layer 26 is in each case one second semiconductor region 3 which has a doping opposite to the doping of the semiconductor layer 26, or in each case a part of a coherent, third semiconductor region 3. A third semiconductor region 4, with a doping opposite to the doping of the semiconductor layer 26, is disposed at the surface 20 of the semiconductor layer 26 between the contact regions 5, in each case with a lateral spacing, preferably an identical spacing a. The lateral distance a between the contact regions 5 and the third semiconductor regions 4 is essentially between approximately 1 $\mu$m and approximately 3 $\mu$m. Contact is made with the contact regions 5 through the use of an electrically conductive layer, preferably made of metal or polysilicon, as a first electrode 7.

The semiconductor regions 3 and 4 each run essentially laterally with respect to the surface 20 of the first semiconductor region 2. In each case one semiconductor region 4 overlaps in a projection along a direction perpendicular to the surface 20 with, in each case, two of the semiconductor regions 3, and each semiconductor region 3 overlaps with in each case two of the semiconductor regions 4. As a result, as shown in FIGS. 4 and 5, in each case laterally running channel regions 22 of the lateral channel lengths L1 and L2 are formed in the semiconductor layer 26 between, in each case, one second semiconductor region 3 and, in each case, one third semiconductor region 4. The lateral extent B of the buried, second semiconductor regions 3 is B=b+2a+L1+L2. On the side of the substrate 27 facing away from the semiconductor layer 26, as a second surface 21 of the first semiconductor region 2, a second electrode 6 is again provided. The operating voltage of the semiconductor configuration is applied between the electrode 6 and the electrode 7. The buried semiconductor regions 3 are spaced apart from one another laterally, preferably with equal spacing A, or, openings are formed with in each case a lateral extent A, in a coherent, second semiconductor region 3. As a result, in each case one channel region 29 of the first semiconductor region 2 is formed by the lateral extent A and the vertical extent D between the second semiconductor regions 3, the channel region 29 extending essentially perpendicularly with respect to the surface 20. The semiconductor part in each channel region 29 is bounded laterally by the depletion zones (not illustrated) of the p-n junctions which are formed by the semiconductor layer 26 and the second semiconductor regions 3. The lateral extent A of the vertical channel regions 29 is preferably selected to be so small that the maximum blocking voltage (reverse voltage) which can be applied between the two electrodes 6 and 7 corresponds at least largely to the maximum volume blocking voltage which the p-n junction can tolerate between the semiconductor regions 2 and 3 on the underside of the second semiconductor regions 3. This corresponds to an at least largely planar profile of the equipotential lines in the blocking state (reduced voltage punchthrough). Typical values for the lateral extent A are between 1 $\mu$m and 10 $\mu$m. When an operating voltage, which is polarized in the forward direction, is applied, a current I flows along the illustrated arrows, between the electrode 7 and the electrode 6, the current running firstly through the lateral channel regions 22 and then in a virtually vertical direction to the surface 20 through the vertical channel regions 29 in the semiconductor layer 26 and then essentially vertically through the semiconductor layer 26 and the substrate 27 to the second electrode 6.

In FIG. 6, each third semiconductor region 4 is then placed in contact with a control electrode (gate electrode) 99 which is buried under an insulator region 11 which electrically insulates the control electrode 99, or control electrodes 99, from the first electrode 7. As a result of a control potential being applied to this control electrode 99, the extent of the depletion zone of the p-n junction between the third semiconductor region 4 and the first semiconductor region 2 can be changed and the conductivity of the channel regions 22 can thus be controlled.

In contrast to the active (controllable) embodiment according to FIG. 6, in the case of the passive (noncontrollable) semiconductor configuration according to FIG. 7, an insulator region 11, which also covers an adjacent edge region of the contact region 5, is provided on the entire free surface 40 of the third semiconductor region 4 which free surface does not adjoin the first semiconductor region 2. The insulator region 11 is shown to have a thickness e. This insulator region 11 then electrically insulates the third semiconductor region 4 and prevents charges (electrons in the case illustrated), which have diffused out of the depletion zone of the p-n junction into a space-charge zone in the third semiconductor region 4, from flowing out of the third semiconductor region 4. The leakage currents of the insulator region 11 should be as low as possible in order to ensure good charge storage in the third semiconductor region 4. A further function of the insulator region 11 is the electrical insulation of the third semiconductor region 4 from the first electrode 7. The dielectric silicon dioxide ($SiO_2$), which is, in particular, grown thermally, is preferably used for the insulator region 11 with both, SiC and Si as the semiconductor. Thermal oxide has excellent insulation properties and can be produced on SiC by dry or wet oxidation at temperatures of above approximately 1000° C.

Figure 8:
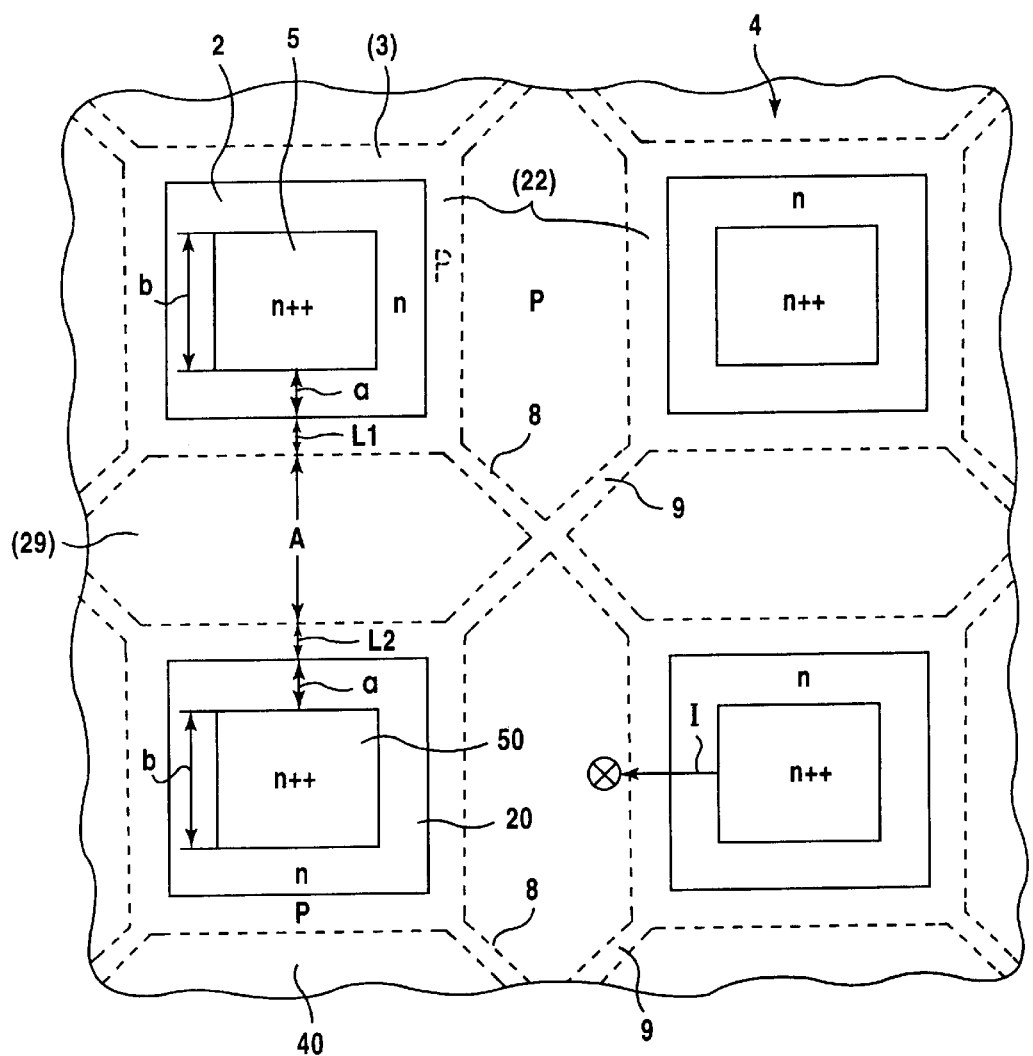
FIG. 8 is a fragmentary top view of a semiconductor configuration having a cellular configuration.

FIG. 8 shows an embodiment of a semiconductor configuration, which could be implemented in its cross section in particular according to FIG. 6 or FIG. 7, in a plan view looking onto the semiconductor surface without electrodes and insulators. In a cell configuration, a plurality of at least approximately square cells are provided, including in each case one source region, as contact region 5, which is formed as a square of the side length b and which has an $n^{++}$ doping. The region 5 is implanted in an n-doped semiconductor layer which serves as the first semiconductor region 2. The square cells further include in each case a p-doped, third semiconductor region 4 which surrounds the $n^{++}$ contact region 5 at a distance a, and a p-doped, second semiconductor region 3 which is buried underneath the contact region 5 by implantation and is illustrated by broken lines. The third semiconductor region 4 with the surface 40 is preferably implanted on the entire surface 20 of the first semiconductor region 2, with the exception of the square cut-outs for the contact regions 5 with the surfaces 50 and the parts of the surface 20 of the first semiconductor region 2 which surround the contact regions 5. In the square-ring-shaped overlapping region of the width L1 or L2, in each case a channel region 22 is again formed underneath the third semiconductor region 4 and above the second semiconductor region 3. In order to place the buried, second semiconductor regions 3 at a common potential, these second semiconductor regions 3 are connected to one another in the first semiconductor region 2 via, in particular, p-doped connections 8 and 9 which run in a cross shape. In each case a continuous channel region 29, extending approximately in the form of a rhomboid with the width A and vertically with respect to the surface 40 or 20, is disposed in the first semiconductor region 2 underneath the third semiconductor region 4, between the connections 8 and 9 and the adjacent third semiconductor regions 3. The current I flows from the source regions (contact regions) 5 firstly approximately laterally (horizontally) through the lateral channel region 22 and then approximately vertically through the adjacent vertical channel regions 29.

Instead of a cell design, a comb-like topology may also be provided. The embodiments according to FIGS. 4 to 8 can also be combined with one another mutatis mutandis.

Figure 9:
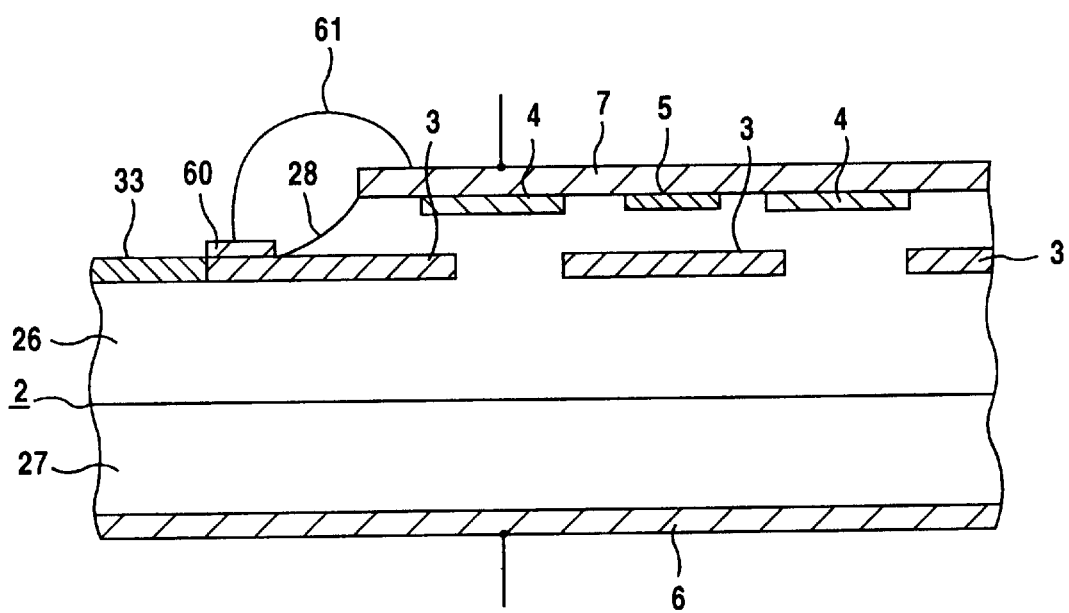
FIG. 9 is a fragmentary cross-sectional view of a semiconductor configuration having buried semiconductor regions which are electrically contacted at an edge.

FIG. 9 shows a further development of an embodiment which is combined from FIGS. 5 and 7. The semiconductor layer 26 is removed at its edge 28 by eroding semiconductor material, for example through the use of an etching process, down to the coherent, buried semiconductor region 3. On the exposed surface of the second semiconductor region 3, a contact 60 is applied. This contact 60 is electrically connected to the first electrode 7 via an electrical connection 61. The two semiconductor regions 3 are connected to the third semiconductor regions 4 at the surface 20 via this electrical contact 61. The electrical contact 61 can also be integrated on the semiconductor configuration or else be an external connection, in particular via a circuit. The selection of the electrical impedance of this electrical connection 61 enables a defined relaxation time (charge discharge time) of the charges stored in the second semiconductor region 3 to be set in the event of a short circuit. In the case of a relatively high ohmic (real) portion of this impedance, the charge storage time may be longer, and thus the limiting current $I_B$ of the semiconductor configuration may be lower. In the event of a relatively low resistance of the connection 61, the charge storage time is shorter and more rapid switching after a short circuit is possible, but the limiting current is higher. Generally, the electrical connection 61 has a higher electrical resistance than the first electrode 7 and can accordingly include a polysilicon line section which has a higher impedance. Adjacent to the exposed, second semiconductor region 3, a planar edge termination 33, which is of the same conduction type as the second semiconductor region 3, but generally has a lower charge carrier concentration, is provided to reduce the field strength on the surface. In a modification of the embodiment shown in FIG. 9, the contacting to the buried, second semiconductor regions 3 can also be made in an inner part of the semiconductor configuration. The embodiments with Schottky contacts and the embodiments with additional p-n junctions to the third semiconductor regions 4 at the surface 20 of the first semiconductor region 2 can also be combined with one another by providing Schottky contacts one next to the other and additional p-n junctions at the same surface 20 of the first semiconductor region 2 in order to limit the electrical punchthrough (reachtrough) to the first electrode 7.

The above-described semiconductor configurations are unipolar components which are extremely well suited for limiting short circuit direct currents and in doing so operate in an intrinsically safe way, and also without actuation (passively). As a result of the embodiment of the semiconductor configuration as a (direct) current limiter, a desired saturation current $I_{Sat}$ can be set which lies above a nominal current range and also a regular overcurrent range which is still tolerable, and above which the semiconductor configuration automatically limits the current to the lower limiting current $I_B$, while taking over voltage.

For the particularly advantageous semiconductor material SiC, generally the following dopant concentrations are selected in all embodiments: for the first semiconductor region 2, in particular the semiconductor layer 26, in a range between approximately $2 \cdot 10^{17}$ cm$^{-3}$ (for a blocking voltage of approximately 60 V) to approximately $2 \cdot 10^{16}$ cm$^{-3}$ (for a blocking voltage of approximately 700 V) and to approximately $6 \cdot 10^{15}$ cm$^{-3}$ (for a blocking voltage of approximately 1200 V), even significantly more than $10^{18}$ cm$^{-3}$ for the substrate 27, and for the second semiconductor regions 3 and the third semiconductor regions 4 between approximately $1 \cdot 10^{18}$ cm$^{-3}$ and approximately $2 \cdot 10^{19}$ cm$^{-3}$, preferably approximately $5 \cdot 10^{18}$ cm$^{-3}$, and for the contact region 5 over approximately $1 \cdot 10^{19}$ cm$^{-3}$. In the case of silicon, these doping concentrations are generally to be divided in each case by approximately 100 (two orders of magnitude smaller).

Figure 10:
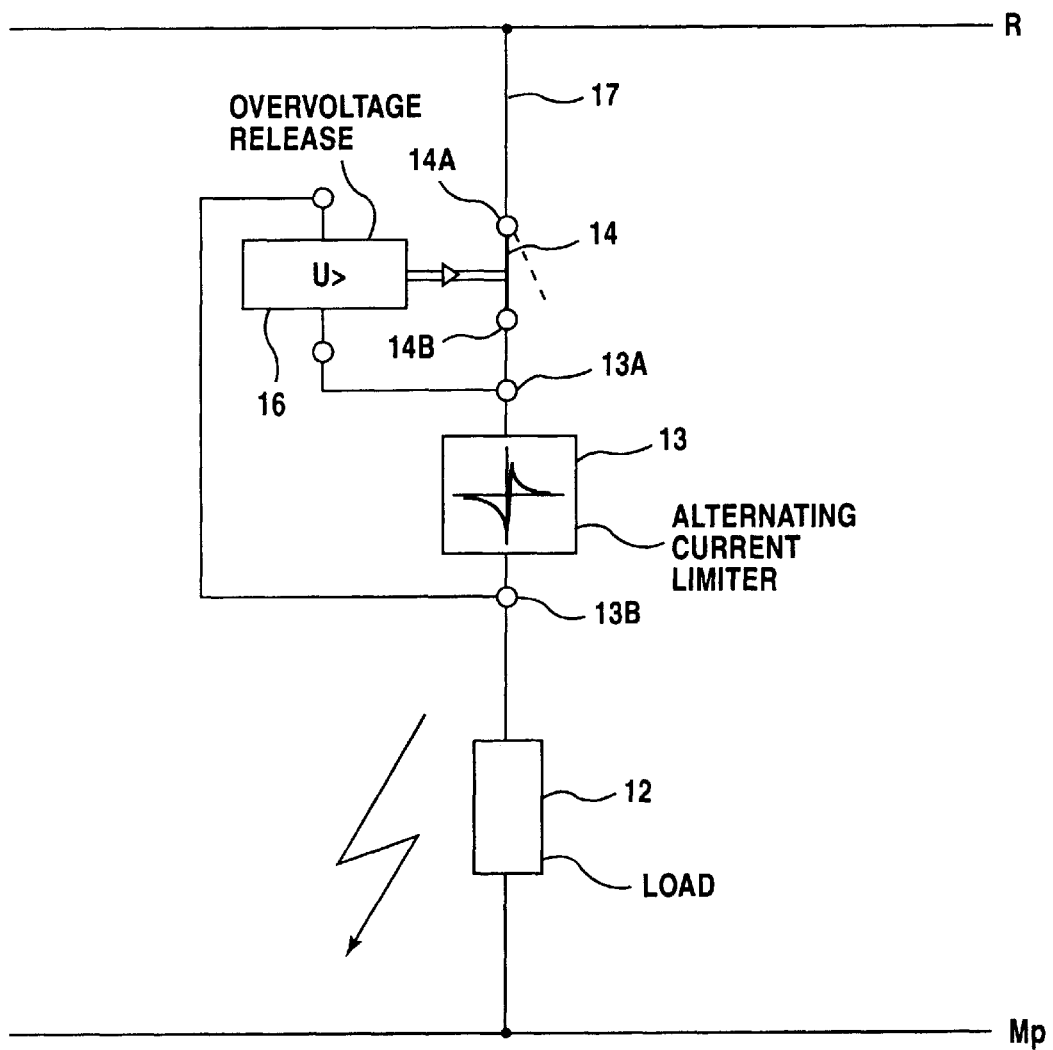
FIG. 10 is a schematic circuit diagram of a switching device with an alternating current limiter for a load.

FIG. 10 shows a switching device in a line branch 17 between a phase R and a ground potential Mp of an electrical alternating voltage supply network, for example a building installation, for an electric load 12. The switching device includes an electronic alternating current limiter 13 which, in particular, may be structured in accordance with one of FIGS. 1 to 3 in conjunction with one of FIGS. 4 to 9, an overvoltage release 16, which picks up the voltage drop between two pickup points 13A and 13B of the alternating current limiter 13, and a switching relay 14 which is connected in series with the alternating current limiter 13 upstream of the load 12 in the line branch 17. The switching relay 14 is triggered (opened) by the overvoltage release 16 when a limiting voltage is exceeded at the current limiter 13, in order to electrically isolate the load 12 from the power supply system (R) in the event of a short circuit. The switching relay 14 does not necessarily have to be particularly fast here, neither are its contacts loaded or stressed by light arcs during the current limiting operation because the electronic alternating current limiter 13 according to the invention limits the current very quickly in significantly less than one millisecond.

We claim:

1. A device for limiting an alternating electric current, comprising:

a passive semiconductor configuration connected into a current path of an alternating current;

said passive semiconductor configuration including a first semiconductor region, a second semiconductor region, a first electrode, and a second electrode;

said first and second electrodes being connected to said first semiconductor region;

said first semiconductor region having a surface, a Schottky contact with a p-n junction depletion zone, and a channel region provided in the current path between said first electrode and said second electrode, said channel region being pinched off by said p-n junction depletion zone when a saturation current is reached;

a contact region disposed at said surface for ohmically contacting said first electrode to said first semiconductor region;

said second semiconductor region being provided within said first semiconductor region underneath said contact region and extending in directions parallel to said surface beyond said contact region;

said p-n junction depletion zone being provided between said first semiconductor region and said second semiconductor region;

said Schottky contact being formed by said first electrode and a portion of said first semiconductor region disposed outside said contact region; and a protection circuit connected to said passive semiconductor configuration and having diodes, said protection circuit preventing said passive semiconductor configuration from being driven to a reverse breakdown voltage by the alternating current.

2. The device according to claim 1, wherein said protection circuit prevents said passive semiconductor configuration from being driven to the reverse breakdown voltage in the event of one of an overcurrent and a short circuit.

3. The device according to claim 1, wherein:

said passive semiconductor configuration is a first semiconductor configuration;

a second semiconductor configuration is connected antiserially to said first passive semiconductor configuration into the current path of the alternating current; and said diodes include a first diode connected antiparallel to said first semiconductor configuration and a second diode connected antiparallel to said second semiconductor configuration, such that in a nominal current range, the alternating current flows at least predominantly through said first semiconductor configuration and said second semiconductor configuration and such that, in case of one of an overcurrent and a short circuit, the alternating current increases monotonously, during half waves having one of a first polarity and a second polarity, up to a saturation current at a saturation voltage at one of said first semiconductor configuration and said second semiconductor configuration, and, at a voltage with one of the first polarity and the second polarity at one of said first semiconductor configuration and said second semiconductor configuration being above the respective saturation voltage, the alternating current being limited to a limiting current by one of said first semiconductor configuration and said second semiconductor configuration and, at the same time, the alternating current flowing essentially exclusively through one of said first semiconductor configuration and said second semiconductor configuration and at least predominantly through one of said second diode and said first diode.

4. The device according to claim 3, wherein said first semiconductor configuration and said second semiconductor configuration are configured such that, in the nominal current range, the alternating current flows essentially entirely through said first semiconductor configuration and said second semiconductor configuration.

5. The device according to claim 1, wherein:

said passive semiconductor configuration is a first semiconductor configuration;

a second semiconductor configuration is connected antiserially to said first passive semiconductor configuration into the current path of the alternating current;

said diodes include a first diode connected antiparallel to said first semiconductor configuration and a second diode connected antiparallel to said second semiconductor configuration;

each of said diodes having a maximum blocking voltage at least as high as a maximum forward voltage at a limiting current of an associated one of said semiconductor configurations connected in antiparallel thereto; and each of said diodes having a threshold conducting voltage smaller in magnitude than the reverse breakdown voltage of an associated one of said semiconductor configurations connected in antiparallel thereto, and additionally, the threshold conducting voltage being smaller than a saturation voltage of a respective one of said semiconductor configurations connected antiparallel to the respective other one of said diodes.

6. The device according to claim 1, wherein:

said passive semiconductor configuration is a first semiconductor configuration;

a second semiconductor configuration is connected to said first semiconductor configuration;

said diodes include a first diode connected in series to said first semiconductor configuration for forming a first series circuit and a second diode connected in series to said second semiconductor configuration for forming a second series circuit; and said first series circuit is connected antiparallel to said second series circuit, each of said diodes having a maximum blocking voltage at least as high as a maximum reverse voltage of an associated one of said semiconductor configurations connected in series thereto.

7. The device according to claim 1, wherein said protection circuit includes two series circuits, each having two diodes connected antiparallel to said passive semiconductor configuration such that, for a first polarity of a forward voltage applied to said passive semiconductor configuration and for a second polarity opposite to the first polarity, the alternating current flows essentially through one of said diodes of a respective one of said series circuits provided in a conducting direction for a given one of the polarities, subsequently flows through said passive semiconductor configuration, in its forward direction, and finally flows through a further one of said diodes provided in the conducting direction.

8. The device according to claim 1, wherein:

said protection circuit is a Graetz bridge circuit having a first diagonal and a second diagonal and including four diodes; and said passive semiconductor configuration is connected along the first diagonal, an alternating voltage corresponding to the alternating current is applied to the second diagonal, each of said diodes has a maximum blocking voltage being at least as high as a maximum forward voltage at a limiting current of said passive semiconductor configuration.

9. The device according to claim 1, wherein at least one of said diodes is a p-n rectifier diode.

10. The device according to claim 1, wherein at least one of said diodes is a Schottky diode.

11. The device according to claim 1, wherein at least one of said diodes is formed from silicon.

12. The device according to claim 1, wherein said passive semiconductor configuration is formed from a semiconductor material having a band gap of at least 2 eV.

13. The device according to claim 12, wherein said semiconductor material is silicon carbide.

14. The device according to claim 1, including a semiconductor substrate, said passive semiconductor configuration and at least one of said diodes being integrated on said semiconductor substrate.

15. The device according to claim 1, including:
further contact regions disposed at said surface of said first semiconductor region;
said second semiconductor region being a coherent semiconductor region formed with openings and disposed underneath said contact region and said further contact regions and extending in directions parallel to said surface of said first semiconductor region beyond all of said contact regions; and
said first semiconductor region having further channel regions each extending through a respective one of said openings in said second semiconductor region, at least one of said further channel regions being electrically connected in series to said channel region.

16. The device according to claim 1, including:
further contact regions disposed at said surface of said first semiconductor region;
further semiconductor regions disposed in said first semiconductor region underneath respective ones of said further contact regions and assigned to respective ones of said further contact regions; and
further channel regions disposed between respective ones of said further semiconductor regions, at least one of said further channel regions being electrically connected in series to said channel region.

17. The device according to claim 1, wherein said first electrode is additionally electrically coupled to said second semiconductor region such that a given relaxation time for stored charges is obtained in said second semiconductor region.

18. A device for limiting an alternating electric current, comprising:
a passive semiconductor configuration connected into a current path of an alternating current;
said passive semiconductor configuration including a first semiconductor region, a second semiconductor region, a third semiconductor region, a first electrode, and a second electrode;
said first and second electrodes being connected to said first semiconductor region;
said first semiconductor region having at least one depletion zone and a channel region provided in the current path between said first electrode and said second electrode, said channel region being pinched off by said at least one depletion zone when a saturation current is reached;
said first semiconductor region having a surface, said third semiconductor region being disposed at said surface of said first semiconductor region, said at least one depletion zone including a first depletion zone being a p-n junction depletion zone formed between said first semiconductor region and said third semiconductor region;
a contact region disposed at said surface of said first semiconductor region, said contact region ohmically contacting said first electrode to said first semiconductor region, said first electrode contacting said third semiconductor region at a given surface thereof, said given surface of said third semiconductor region not adjoining said first semiconductor region;
said second semiconductor region being provided within said first semiconductor region underneath said contact region and extending in directions parallel to said surface of said first semiconductor region beyond said contact region;
said at least one depletion zone including a second depletion zone being a further p-n junction depletion zone provided between said first semiconductor region and said second semiconductor region; and
a protection circuit connected to said passive semiconductor configuration and having diodes, said protection circuit preventing said passive semiconductor configuration from being driven to a reverse breakdown voltage by the alternating current.

19. The device according to claim 18, wherein said protection circuit prevents said passive semiconductor configuration from being driven to the reverse breakdown voltage in the event of one of an overcurrent and a short circuit.

20. The device according to claim 18, wherein:
said passive semiconductor configuration is a first semiconductor configuration;
a second semiconductor configuration is connected antiserially to said first passive semiconductor configuration into the current path of the alternating current;
said diodes include a first diode connected antiparallel to said first semiconductor configuration and a second diode connected antiparallel to said second semiconductor configuration, such that in a nominal current range, the alternating current flows at least predominantly through said first semiconductor configuration and said second semiconductor configuration and such that, in case of one of an overcurrent and a short circuit, the alternating current increases monotonously, during half waves having one of a first polarity and a second polarity, up to a saturation current at a saturation voltage at one of said first semiconductor configuration and said second semiconductor configuration, and, at a voltage with one of the first polarity and the second polarity at one of said first semiconductor configuration and said second semiconductor configuration being above the respective saturation voltage, the alternating current being limited to a limiting current by one of said first semiconductor configuration and said second semiconductor configuration and, at the same time, the alternating current flowing essentially exclusively through one of said first semiconductor configuration and said second semiconductor configuration and at least predominantly through one of said second diode and said first diode.

21. The device according to claim 20, wherein:
said first semiconductor configuration and said second semiconductor configuration are configured such that, in the nominal current range, the alternating current flows essentially entirely through said first semiconductor configuration and said second semiconductor configuration.

22. The device according to claim 18, wherein:
said passive semiconductor configuration is a first semiconductor configuration;
a second semiconductor configuration is connected antiserially to said first passive semiconductor configuration into the current path of the alternating current;
said diodes include a first diode connected antiparallel to said first semiconductor configuration and a second diode connected antiparallel to said second semiconductor configuration;
each of said diodes has a maximum blocking voltage at least as high as a maximum forward voltage at a limiting current of an associated one of said semiconductor configurations connected in antiparallel thereto; and
each of said diodes has a threshold conducting voltage smaller in magnitude than the reverse breakdown voltage of an associated one of said semiconductor configurations connected in antiparallel thereto, and additionally, the threshold conducting voltage being smaller than a saturation voltage of a respective one of said semiconductor configurations connected antiparallel to the respective other one of said diodes.

23. The device according to claim 18, wherein:
said passive semiconductor configuration is a first semiconductor configuration;
a second semiconductor configuration is connected to said first semiconductor configuration;
said diodes include a first diode connected in series to said first semiconductor configuration for forming a first series circuit and a second diode connected in series to said second semiconductor configuration for forming a second series circuit;
said first series circuit is connected antiparallel to said second series circuit; and
each of said diodes has a maximum blocking voltage at least as high as a maximum reverse voltage of an associated one of said semiconductor configurations connected in series thereto.

24. The device according to claim 18, wherein said protection circuit includes two series circuits, each of said series circuits has two diodes connected antiparallel to said passive semiconductor configuration such that, for a first polarity of a forward voltage applied to said passive semiconductor configuration and for a second polarity opposite to the first polarity, the alternating current flows essentially through one of said diodes of a respective one of said series circuits provided in a conducting direction for a given one of the polarities, subsequently flows through said passive semiconductor configuration, in its forward direction, and finally flows through a further one of said diodes provided in the conducting direction.

25. The device according to claim 18, wherein:
said protection circuit is a Graetz bridge circuit having a first diagonal and a second diagonal and including four diodes; and
said passive semiconductor configuration is connected along the first diagonal, an alternating voltage corresponding to the alternating current is applied to the second diagonal, each of said diodes has a maximum blocking voltage being at least as high as a maximum forward voltage at a limiting current of said passive semiconductor configuration.

26. The device according to claim 18, wherein at least one of said diodes is a p-n rectifier diode.

27. The device according to claim 18, wherein at least one of said diodes is a Schottky diode.

28. The device according to claim 18, wherein at least one of said diodes is formed from silicon.

29. The device according to claim 18, wherein said passive semiconductor configuration is formed from a semiconductor material having a band gap of at least 2 eV.

30. The device according to claim 29, wherein said semiconductor material is silicon carbide.

31. The device according to claim 18, including a semiconductor substrate, said passive semiconductor configuration and at least one of said diodes being integrated on said semiconductor substrate.

32. The device according to claim 18, including:
further contact regions disposed at said surface of said first semiconductor region;
said second semiconductor region being a coherent semiconductor region formed with openings and disposed underneath said contact region and said further contact regions and extending in directions parallel to said surface of said first semiconductor region beyond all of said contact regions; and
said first semiconductor region having further channel regions each extending through a respective one of said openings in said second semiconductor region, at least one of said further channel regions being electrically connected in series to said channel region.

33. The device according to claim 18, including:
further contact regions disposed at said surface of said first semiconductor region;
further semiconductor regions disposed in said first semiconductor region underneath respective ones of said further contact regions and assigned to respective ones of said further contact regions; and
further channel regions disposed between respective ones of said further semiconductor regions, at least one of said further channel regions being electrically connected in series to said channel region.

34. The device according to claim 18, wherein said first electrode is electrically coupled to said second semiconductor region such that a given relaxation time for stored charges is obtained in said second semiconductor region.

35. A device for limiting an alternating electric current, comprising:
a passive semiconductor configuration connected into a current path of an alternating current;
said passive semiconductor configuration including a first semiconductor region, a second semiconductor region, a third semiconductor region, a first electrode, and a second electrode;
said first and second electrodes being connected to said first semiconductor region;
said first semiconductor region having at least one depletion zone and a channel region provided in the current path between said first electrode and said second electrode, said channel region being pinched off by said at least one depletion zone when a saturation current is reached;
said first semiconductor region having a surface, said third semiconductor region being disposed at said surface of said first semiconductor region, said at least one depletion zone including a first depletion zone being a p-n junction depletion zone formed between said first semiconductor region and said third semiconductor region;

a contact region disposed at said surface of said first semiconductor region, said contact region ohmically contacting said first electrode to said first semiconductor region;

said second semiconductor region being provided within said first semiconductor region underneath said contact region and extending in directions parallel to said surface of said first semiconductor region beyond said contact region;

said at least one depletion zone including a second depletion zone being a further p-n junction depletion zone provided between said first semiconductor region and said second semiconductor region;

said third semiconductor region has a given surface not adjoining said first semiconductor region;

an insulator region covering said given surface of said third semiconductor region for storing charges in said third semiconductor region; and a protection circuit connected to said passive semiconductor configuration and having diodes, said protection circuit preventing said passive semiconductor configuration from being driven to a reverse breakdown voltage by the alternating current.

36. The device according to claim 35, wherein said protection circuit prevents said passive semiconductor configuration from being driven to the reverse breakdown voltage in the event of one of an overcurrent and a short circuit.

37. The device according to claim 35, wherein:

said passive semiconductor configuration is a first semiconductor configuration;

a second semiconductor configuration is connected antiserially to said first passive semiconductor configuration into the current path of the alternating current;

said diodes include a first diode connected antiparallel to said first semiconductor configuration and a second diode connected antiparallel to said second semiconductor configuration, such that in a nominal current range, the alternating current flows at least predominantly through said first semiconductor configuration and said second semiconductor configuration and such that, in case of one of an overcurrent and a short circuit, the alternating current increases monotonously, during half waves having one of a first polarity and a second polarity, up to a saturation current at a saturation voltage at one of said first semiconductor configuration and said second semiconductor configuration, and, at a voltage with one of the first polarity and the second polarity at one of said first semiconductor configuration and said second semiconductor configuration being above the respective saturation voltage, the alternating current being limited to a limiting current by one of said first semiconductor configuration and said second semiconductor configuration and, at the same time, the alternating current flowing essentially exclusively through one of said first semiconductor configuration and said second semiconductor configuration and at least predominantly through one of said second diode and said first diode.

38. The device according to claim 37, wherein said first semiconductor configuration and said second semiconductor configuration are configured such that, in the nominal current range, the alternating current flows essentially entirely through said first semiconductor configuration and said second semiconductor configuration.

39. The device according to claim 35, wherein:

said passive semiconductor configuration is a first semiconductor configuration;

a second semiconductor configuration is connected antiserially to said first passive semiconductor configuration into the current path of the alternating current;

said diodes include a first diode connected antiparallel to said first semiconductor configuration and a second diode connected antiparallel to said second semiconductor configuration;

each of said diodes has a maximum blocking voltage at least as high as a maximum forward voltage at a limiting current of an associated one of said semiconductor configurations connected in antiparallel thereto; and each of said diodes has a threshold conducting voltage smaller in magnitude than the reverse breakdown voltage of an associated one of said semiconductor configurations connected in antiparallel thereto, and additionally, the threshold conducting voltage being smaller than a saturation voltage of a respective one of said semiconductor configurations connected antiparallel to the respective other one of said diodes.

40. The device according to claim 35, wherein:

said passive semiconductor configuration is a first semiconductor configuration;

a second semiconductor configuration is connected to said first semiconductor configuration;

said diodes include a first diode connected in series to said first semiconductor configuration for forming a first series circuit and a second diode connected in series to said second semiconductor configuration for forming a second series circuit;

said first series circuit is connected antiparallel to said second series circuit; and each of said diodes has a maximum blocking voltage at least as high as a maximum reverse voltage of an associated one of said semiconductor configurations connected in series thereto.

41. The device according to claim 35, wherein said protection circuit includes two series circuits, each of said series circuits has two diodes connected antiparallel to said passive semiconductor configuration such that, for a first polarity of a forward voltage applied to said passive semiconductor configuration and for a second polarity opposite to the first polarity, the alternating current flows essentially through one of said diodes of a respective one of said series circuits provided in a conducting direction for a given one of the polarities, subsequently flows through said passive semiconductor configuration, in its forward direction, and finally flows through a further one of said diodes provided in the conducting direction.

42. The device according to claim 35, wherein:

said protection circuit is a Graetz bridge circuit having a first diagonal and a second diagonal and including four diodes; and said passive semiconductor configuration is connected along the first diagonal, an alternating voltage corresponding to the alternating current is applied to the second diagonal, each of said diodes has a maximum blocking voltage being at least as high as a maximum forward voltage at a limiting current of said passive semiconductor configuration.

43. The device according to claim 35, wherein at least one of said diodes is a p-n rectifier diode.

44. The device according to claim 35, wherein at least one of said diodes is a Schottky diode.

45. The device according to claim 35, wherein at least one of said diodes is formed from silicon.

46. The device according to claim 35, wherein said passive semiconductor configuration is formed from a semiconductor material having a band gap of at least 2 eV.

47. The device according to claim 46, wherein said semiconductor material is silicon carbide.

48. The device according to claim 35, including a semiconductor substrate, said passive semiconductor configuration and at least one of said diodes being integrated on said semiconductor substrate.

49. The device according to claim 35, including:

contact regions disposed at said surface of said first semiconductor region;

said second semiconductor region being a coherent semiconductor region formed with openings and disposed underneath said contact region and extending in directions parallel to said surface of said first semiconductor region beyond all of said contact regions; and said first semiconductor region having further channel regions each extending through a respective one of said openings in said second semiconductor region, at least one of said further channel regions being electrically connected in series to said channel region.

50. The device according to claim 35, including:

further contact regions disposed at said surface of said first semiconductor region;

further semiconductor regions disposed in said first semiconductor region underneath respective ones of said contact regions and assigned to respective ones of said contact regions; and further channel regions disposed between respective ones of said further semiconductor regions, at least one of said further channel regions being electrically connected in series to said channel region.

51. The device according to claim 35, wherein said first electrode is electrically coupled to said second semiconductor region such that a given relaxation time for stored charges is obtained in said second semiconductor region.

* * * * *